United States Patent [19]

Miller et al.

[11] Patent Number: 4,683,421
[45] Date of Patent: Jul. 28, 1987

[54] DRIFT COMPENSATION TECHNIQUE FOR A MAGNETO-OPTIC CURRENT SENSOR

[75] Inventors: Robert C. Miller, Penn Hills Twp.; Juris A. Asars, Murrysville Boro, both of Pa.

[73] Assignee: Westinghouse Electric Corp., Pittsburgh, Pa.

[21] Appl. No.: 717,989

[22] Filed: Mar. 29, 1985

[51] Int. Cl.⁴ .................. G01R 31/00; G01R 33/00; G01J 1/32; G02F 1/31
[52] U.S. Cl. ................ 324/96; 324/117 R; 250/205; 250/225; 350/375; 350/376
[58] Field of Search ........ 324/96, 117 R, 224, 324/244; 332/7.51; 455/610, 609, 612; 250/205, 225, 227, 231 R; 350/375, 376

[56] References Cited

U.S. PATENT DOCUMENTS

| | | | |
|---|---|---|---|
| 3,324,393 | 7/1963 | Casey et al. | 324/96 |
| 3,419,802 | 3/1968 | Pelenc et al. | 250/225 |
| 3,543,151 | 1/1968 | Pelenc et al. | 250/225 |
| 3,597,683 | 8/1971 | Salto et al. | 324/96 |
| 3,629,703 | 12/1971 | Bernard | 324/96 |
| 3,707,329 | 12/1972 | Jaecklin et al. | 350/160 |
| 3,708,747 | 1/1973 | Lesueur | 324/96 |
| 3,743,929 | 7/1973 | Lesueur | 324/96 |
| 3,753,101 | 8/1973 | Aumont | 324/96 |
| 3,754,143 | 8/1973 | Lesueur | 250/204 |
| 3,769,584 | 10/1973 | Iten et al. | 324/96 |
| 3,778,619 | 12/1973 | Carnel | 324/96 |
| 3,906,343 | 9/1975 | Feldtkeller | 324/96 |
| 4,070,620 | 1/1978 | Feldtkeller et al. | 324/96 |
| 4,147,979 | 4/1979 | Baues et al. | 324/244 |
| 4,232,264 | 11/1980 | Papp et al. | 324/127 |
| 4,243,936 | 1/1981 | Papp et al. | 324/96 |
| 4,269,483 | 5/1981 | Feldtkeller | 350/390 |
| 4,290,146 | 9/1981 | Adolfsson et al. | 455/612 |
| 4,316,141 | 2/1982 | Adolfsson et al. | 455/612 |
| 4,356,448 | 10/1982 | Brogardh et al. | 324/96 |
| 4,370,612 | 1/1983 | Peuch et al. | 324/117 R |
| 4,540,937 | 9/1985 | Asars | 324/96 |
| 4,547,729 | 10/1985 | Adolfsson et al. | 324/96 |

OTHER PUBLICATIONS

IEEE Journal of Quantum Electronics, vol. QE-18, No. 10, Oct. 1982 "Fiber Optic Measuring System for Electric Current by Using a Magnetooptic Sensor.

Primary Examiner—Reinhard J. Eisenzopf
Assistant Examiner—Vinh P. Nguyen
Attorney, Agent, or Firm—Daniel C. Abeles

[57] ABSTRACT

Drift compensation for the output signal of a magneto-optic current measuring system is achieved through the use of two light emitting sources, each at different frequencies, to generate two alternating optical input signals to the current sensor to establish a signal reference in order to compensate for signal drift caused by variable attenuator characteristics of the optical elements in the system.

4 Claims, 5 Drawing Figures

DRIFT COMPENSATION TECHNIQUE FOR A MAGNETO-OPTIC CURRENT SENSOR

BACKGROUND OF THE INVENTION

Magneto-optic current sensors have found widespread application as a substitute for conventional current transformers to provide measurement of currents in high voltage systems. The magnetic field produced by the current flow effects a rotation of a light beam in accordance with the Faraday effect. The rotation of the light beam is indicative of the magnitude of the current flow. In the construction of precision AC and DC magneto-optic sensors for use in applications requiring long-term stability, it is necessary to provide for automatic compensation for drift which may result from aging of the components, noisy environment, etc.

SUMMARY OF THE INVENTION

There is disclosed herein with reference to the accompanying drawings a unique technique for providing drift compensation for a magneto-optic current sensor wherein two light sources, each emitting light at different frequencies, generate two alternating optical signals in the magneto-optic sensor to provide a basis for compensating for drift caused by variable attenuation characteristics of the optical elements in the system.

BRIEF DESCRIPTION OF THE DRAWINGS

The invention will become readily apparent from the following exemplary description in connection with the accompanying drawings.

DESCRIPTION OF THE PREFERRED EMBODIMENT

Figure 1:
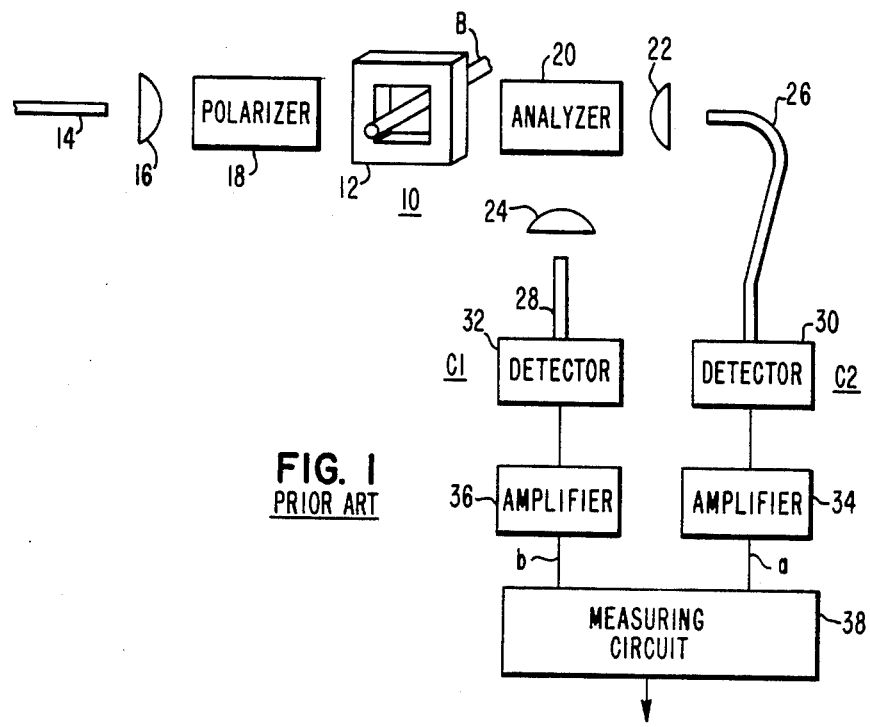
FIG. 1 is a block diagram schematic of a conventional prior art drift compensation technique for use with a magneto-optic current sensor.

A conventional prior art approach to measuring current with a magneto-optic current sensor is illustrated in FIG. 1. The current measuring system 10 of FIG. 1 includes a magneto-optic element 12 having as its input the light entering through the optical fiber 14, collimating lens 16 and the polarizer 18. The polarized light from polarizer 18 passes through the magneto-optic element 12 where the plane of polarization is rotated through a small angle in response to the current flow in the electrical conductor B which is oriented perpendicular to the element 12. The output of the magneto-optic element 12 enters the analyzer 20 which is constructed to provide two outputs. The outputs are such that one light output is polarized at an angle of 90° with respect to the second light output. The analyzer 20 is oriented so that the polarization axis of one of the outputs is at an angle of +45° with respect to the polarization axes of the polarizer 18, and the other light output at an angle of −45° with respect to the polarization axis of the polarizer 18. The collimating lenses 22 and 24 focus the respective light outputs into optical fibers 26 and 28, respectively. The detectors 30 and 32 convert the optical signals into electric signals which are amplified by amplifiers 34 and 36, respectively. The electrical output signals a and b are proportional to the two optical outputs of the analyzer 20. If the effective gains of the two signal processing channels C1 and C2 are equal, and assuming a magneto-optic element 12 which forms a closed path around the bus bar B, it can be shown that:

$$(a-b)/(a+b) = \sin 2\theta = \sin(2\,VI) \sim 2VI$$

where I is the current and V is the Verdet Constant of the material of the magneto-optic element 12. Electronic measuring circuit 38 computes the above ratio and develops an output which is proportional to current. The output is independent of changes in the intensity of the light source and changes in attenuation of the optical components up to the analyzer 20. However, any change in the effective gain of the parallel signal processing channels C1 and C2 which couple the output of the analyzer 20 to the electronic measuring circuit 38 produces an error in the current measurement.

For the purpose of explanation, if it is assumed that the effective gain of one channel is $G_a$ and that of the second channel is $G_b = G_a(1+\delta)$, then the measured current I' is related to the true current I by the equation:

$$\frac{I'}{I} = 1 - \frac{\delta}{4VI}$$

Thus, for a 10% difference in gain, $\delta=0.1$, and a current at the upper end of the linear range defined by the relationship where $\sin 2\theta = 2\theta$ and $2VI=0.1$, there would be a 50% error in the measured current and larger errors would result at lower currents. Therefore, unless the gains of the two signal processing channels are essentially equal, the system 10 cannot be used to reliably measure current flowing in the electrical conductor B. While the gains in the signal processing channels can be monitored by periodically turning off the current and adjusting the gain of one of the signal processing channels so that the output of the electronic measuring circuit is zero, such a procedure is not acceptable for most applications of the magneto-optic current sensor.

Figure 2:
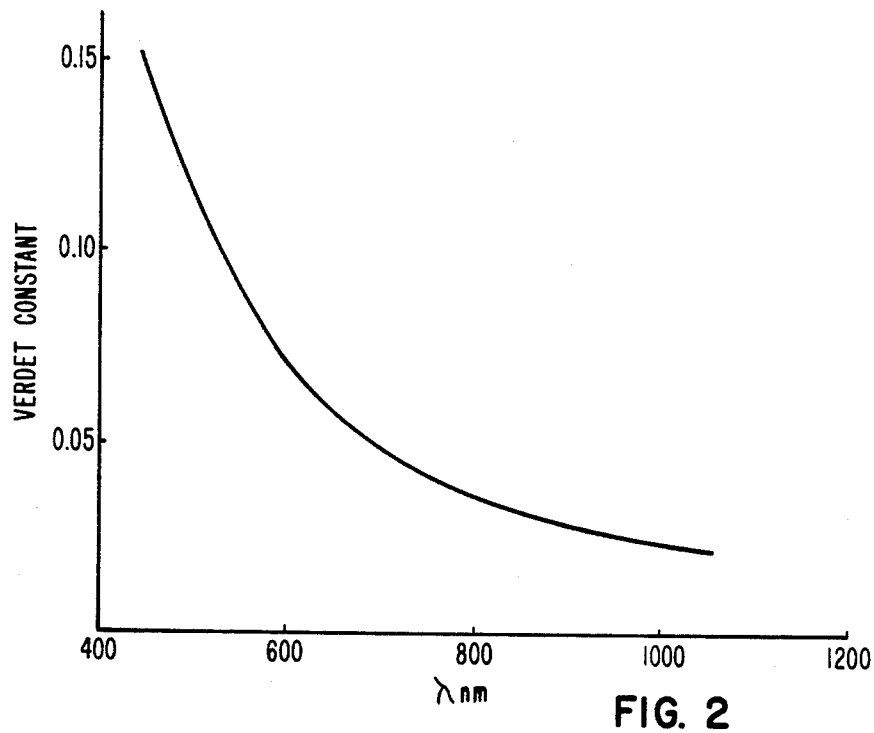
FIG 2 is a graphical illustration of the variation of Verdet constant with wavelengths for SF6 glass.

The magneto-optic material of the current sensors described herein make use of the fact that the Verdet Constant of the magneto-optic material is a function of the wavelength of the light used in the measurement. This relationship is typically illustrated graphically in FIG. 2 for SF6 glass which is commercially available from Schott Optical Glass Inc. The material exhibits two different Verdet Constants when subjected to light of two different wavelengths.

Assuming a current is first measured at wavelength $\lambda_1$ and then, after changing only the light source of FIG. 1, the gain is measured at a second wavelength $\lambda_2$, and the resulting gains of the channels C1 and C2 are equal, then the two outputs $E_1$ and $E_2$ of electronic measuring circuit 38 will satisfy the following relationship:

$$E_1 V_2 = E_2 V_1$$

where $E_1$ is the value of $(a-b/a+b)$ measured at wavelength $\lambda_1$, and $E_2$ is the value of $(a-b/a+b)$ measured at wavelength $\lambda_2$, and $V_1$ and $V_2$ are the Verdet Constants of the magneto-optical material at wavelengths $\lambda_1$ and $\lambda_2$, respectively.

Figure 3:
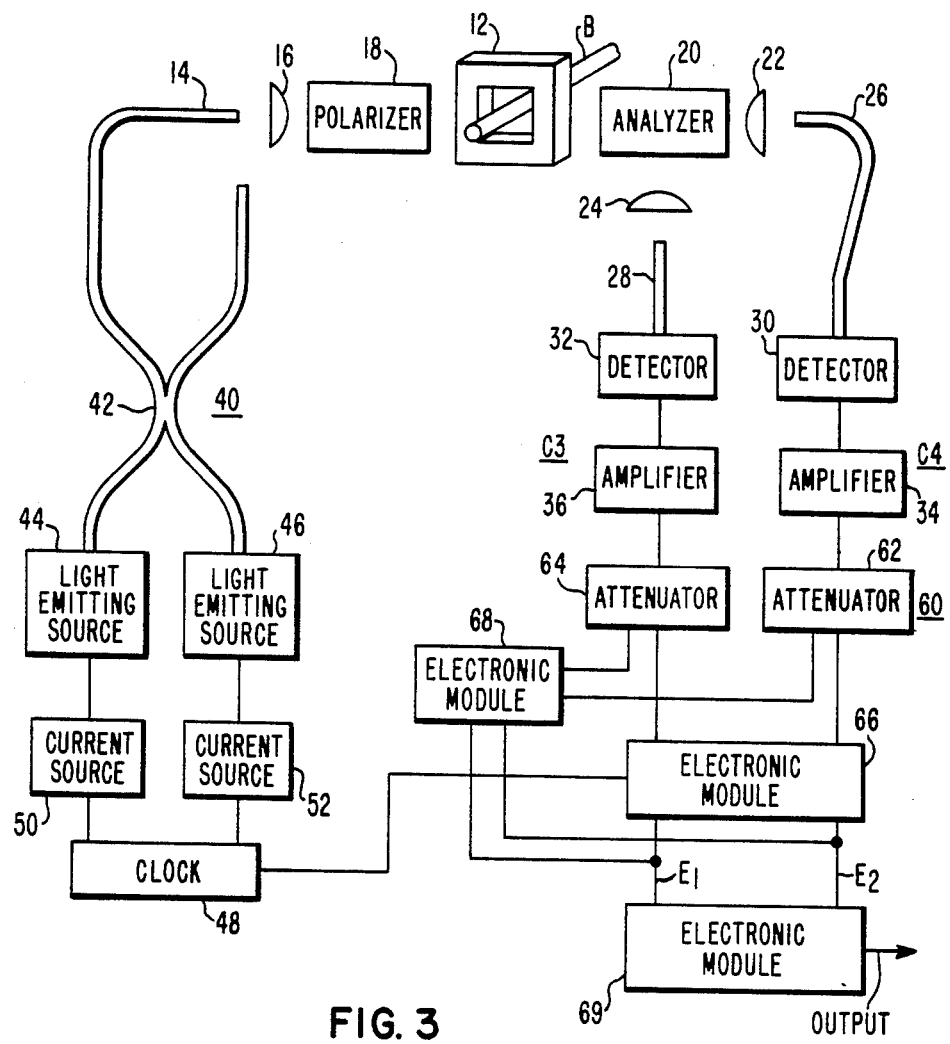
FIG. 3 is a schematic block diagram of a drift compensation technique employing the invention.

A system operating at two wavelengths in which the gain is automatically adjusted to maintain $E_1V_2=E_2V_1$ and which calculates $(E_1-E_2)/(V_1-V_2)$ to provide a drift-free output proportional to current is shown in block diagram form in FIG. 3 wherein the system of FIG. 1 has been modified through the addition of an input circuit 40 and an output circuit 60.

The input circuit 40 includes an optical directional coupler 42 which introduces light into optical fiber 14 in response to the outputs of light emitting sources 44 and 46. The light emitting sources 44 and 46, which may be typically implemented through the use of light emitting diodes, emit light at two different wavelengths $\lambda_1$ and $\lambda_2$. The activation of these light emitting sources 44 and 46 is controlled by the operation of a clock, or timing module, 48 which alternately provides signals to current sources 50 and 52. Thus, the light in fiber optic element 14, which is connected to one arm of the directional coupler 42, is alternately at wavelength $\lambda_1$ and at wavelength $\lambda_2$. The outputs of the amplifiers 34 and 36 are supplied through variable attenuators 62 and 64 to the electronic circuit 66. The function of the variable attenuators 62 and 64 may be implemented through the use of commercially available LED-photoconductor isolators such as the Clairex CLM50, or through the use of transconductance operational amplifiers such as RCA CA3080. The electronic circuit 66 includes a demultiplexer circuit which receives its timing signal from clock 48, and circuitry to compute the ratio $(a-b)/(a+b)$ at wavelength $\lambda_1$ and the same ratio at wavelength $\lambda_2$ so as to provide output signals $E_1$ and $E_2$ which are proportional to the computed quantities. The circuitry of circuit 66 may be realized through the use of two operational amplifiers, one to produce $(a-b)$ and one to produce $(a-b)$ followed by an analog divider, such as Burr Brown DIV100, and an analog switch and two holding circuits.

The electronic module 68 which consists typically of a current summing operational amplifier computes $V_2E_1-V_1E_2$ and provides an error signal which adjusts the attenuators 62 and 64 such that $V_2E_1=V_1E_2$, thereby assuring that the gains of the two signal processing channels C3 and C4 are always equal. The electronic circuit 69, which consists typically of a differential amplifier, responds to the output signals of circuits 66 and 68 by computing $E_1-E_2/V_1-V_2$, wherein $V_1-V_2$ is the constant of the material, and providing an output signal which is proportional to the current measured in the electrical conductor B. This signal is independent of changes in attenuation of the optical components of the system of FIG. 3.

Figure 4:
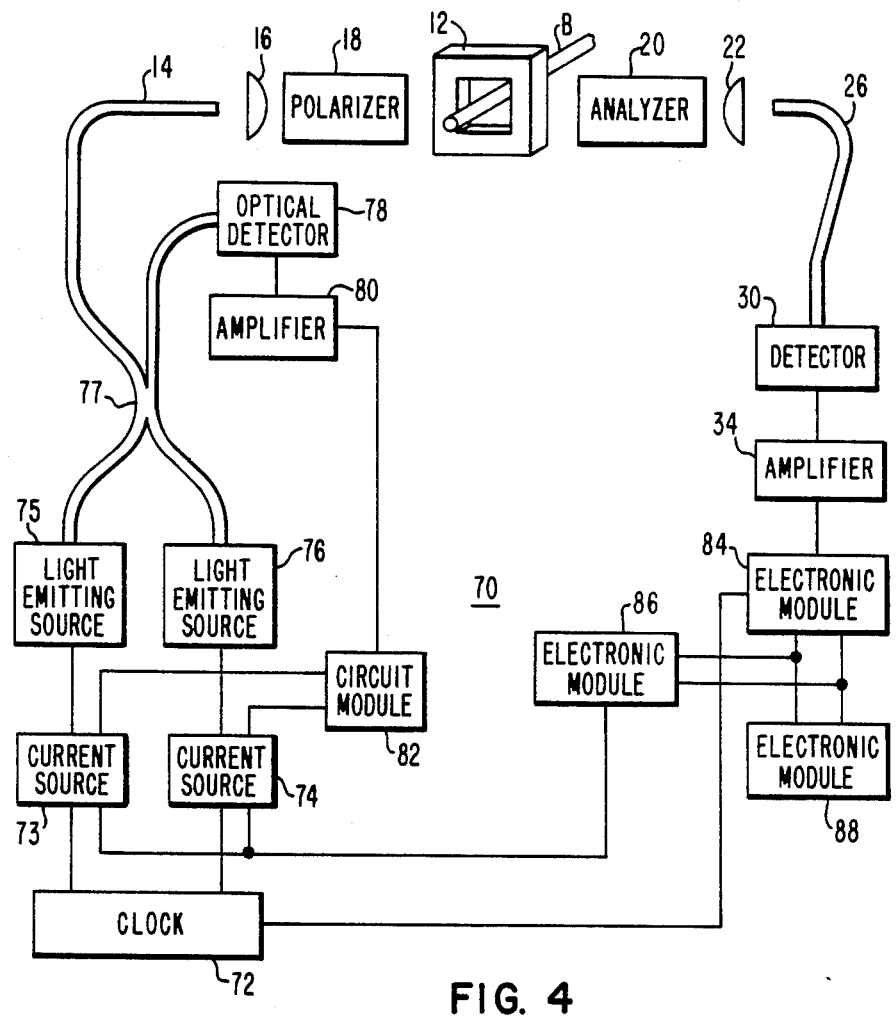
FIG 4 is a block diagram schematic of a simplified implementation of the invention.

The functional objectives achieved by the implementation of FIG. 3 can be realized in a somewhat simpler configuration as shown in FIG. 4. Referring to FIG. 4, the functions of the input circuit 40 and output circuit 60 of FIG. 3 are replaced by circuit 70. A clock, or timing module, 72 provides alternate signals to two current sources 73 and 74 which alternately activate two light emitting sources 75 and 76 of different wavelengths. Light source 75 producing light at wavelength $\lambda_1$ and light source 76 producing light at wavelength $\lambda_2$. The outputs of the light emitting sources 75 and 76 are directed through the optical coupler 77 which has one output branch connected to the optical fiber 14 and the second optical branch connected to an optical detector 78 such as a PIN diode commercially available as Hamamatsu S1190. The output of the optical detector 78 is amplified by amplifier 80 and supplied to the circuit module 82 which includes a demultiplexer for providing an output signal proportional to the difference in intensity of the light at wavelength $\lambda_1$ and the light at wavelength $\lambda_2$. The resulting error signal produced by the circuit 82 is supplied to the current sources 73 and 74 where the relative current flow through the respective light emitting sources 75 and 76 is adjusted such that the difference in intensity approaches zero. The output of the optical coupler 77 supplied to the optical fiber 14 is processed through the magneto-optical element 12 as described above. Electronic module 84, which is coupled to the output of the amplifier circuit 34, includes a demultiplexer circuit, which receives its timing signals from the clock 72, and provides two outputs, $O_1$ and $O_2$, which are proportional to the intensity of the light reaching the element 12 at wavelengths $\lambda_1$ and $\lambda_2$, respectively. The electronic module 86, typically a differential amplifier, computes the quantity $O_1V_2-O_2V_1$, wherein $V_1$ and $V_2$ are Verdet Constants, and subtracts it from a fixed quantity $K_0$ to provide an error signal to the current sources 73 and 74. The error signal alters the intensity of the light emanating from light sources 75 and 76 equally and maintains $O_1V_2-O_2V_1$ at a constant value while the input from circuit 82 maintains the intensity ratio at wavelengths $\lambda_1$ and $\lambda_2$ constant at the output of the coupler 77.

The electronic module 88 computes the difference between $O_1$ and $O_2$ and provides an output proportional to the current flowing in the electrical conductor B. The embodiment of FIG. 4 is less complicated than that illustrated in FIG. 3 and is immune to changes in attenuation in the optical system provided the changes are equal at the two wavelengths.

Figure 5:
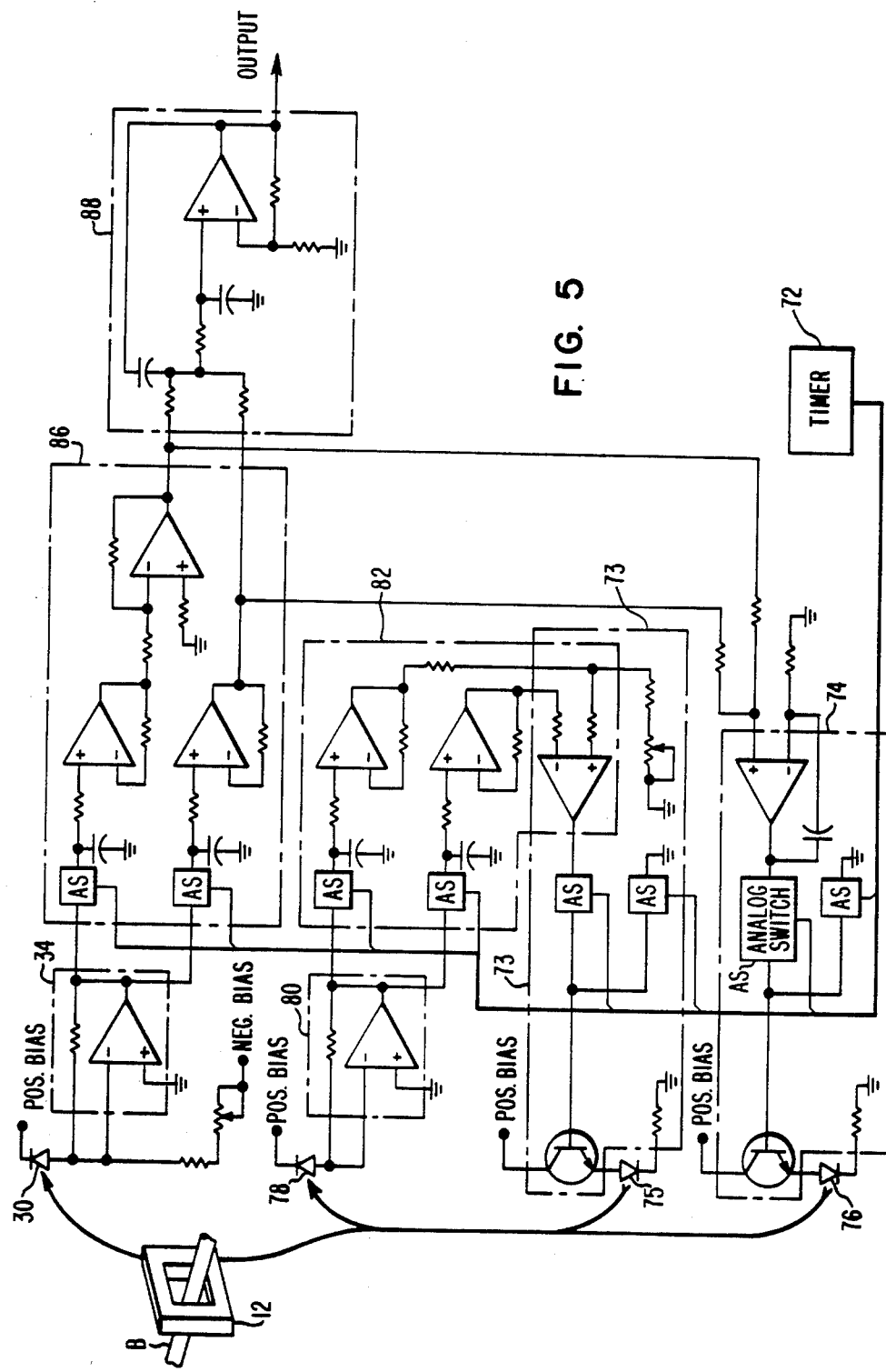
FIG. 5 is a discrete schematic illustration of a block diagram embodiment of FIG. 4.

A discrete component schematic illustration of an implementation of the system of FIG. 4 is illustrated in FIG. 5.

The compensation technique described above is applicable to both AC and DC current measurements employing a magneto-optic current sensor. A requirement for successful use in AC current measurements being a switching frequency of the light sources being substantially higher than the highest frequency of interest in the current to be measured. A typical light source switching frequency being 100 kilohertz.

What is claimed is:

1. In a magneto-optic current measuring system including a magneto-optic current sensor of a material composition exhibiting different Verdet Constants (V) at different wavelengths, and functioning as a Faraday rotator by receiving a polarized light input and generating two light output signals in response to current flow in an adjacent electrical conductor, and circuit means for converting the light output signals into electrical signals a and b, the ratio $(a-b)/(a+b)$ of which is indicative of current flow in said electrical conductor;

the improvement for providing drift compensation for said system, said improvement comprising: and input circuit means including:

(a) a first light source for emitting light at a first wavelength $(\lambda_1)$ and a second light source for emitting light at a second wavelength $(\lambda_2)$;

(b) a light activating control means for alternately activating said first and second light sources; and (c) an optical coupler means for introducing the light output from said alternately activated first and second light sources to said magneto-optic current sensor; and and output circuit means including:

(a) a first and second variable attenuator means for supplying the electrical signals a and b to a first computational circuit means;

(b) said first computational circuit means computing the ratio $(a-b)/(a+b)$ at both wavelengths $\lambda_1$ and $\lambda_2$ and producing output signals $E_1$ and $E_2$ representative of said respective ratios, and (c) a second computational circuit means operatively connected to said first computational circuit means to compute an error signal $V_2E_1-V_1E_2$ wherein $V_1$ is the Verdet Constant of the material composition of said magneto-optic current sensor at wavelength $\lambda_1$ and $V_2$ is the Verdet Constant of the material composition of said magneto-optic current sensor at wavelength $\lambda_2$, said error signal being supplied to said first and second variable attenuator means to modify the signals a, b to effect drift compensation by maintaining the relationship $V_2E_1 = V_1E_2$.

2. In a magneto-optic current measuring system including a magneto-optic current sensor of a material composition exhibiting different Verdet Constants (V) at different wavelengths, and functioning as a Faraday rotator by receiving a polarized light input and generating a light output, the rotation of which is indicative of the current flow in an adjacent electrical conductor, and converter means for converting said light output to electrical signals, the improvement for providing drift compensation for said system, said improvement comprising, an input circuit means including:

(a) a first light source for emitting light at a first wavelength and a second light source for emitting light at a second wavelength;

(b) a light activating control means for alternately activating said first and second light sources;

(c) an optical detector means;

(d) an optical coupler means for directing the light output from said first and second light sources to both said magneto-optic current sensor and said optical detector means; said optical detector means developing electrical output signals indicative of the light at each of said first and second wavelengths; and (e) an input intensity control circuit means responding to the electrical output signals of said optical detector means by producing a first error signal which is a function of the difference in the intensity of the light at said first and second wavelengths; the error signal being supplied to said light activating control means to modify the light output from said first and second light sources such that the difference in intensity is essentially zero; and an output circuit means including:

(a) a demultiplexer circuit means responding to electrical signals representing the light output of said first and second light sources transmitted through said magneto-optic current sensor by generating two output signals $O_1$ and $O_2$ indicative of the intensity of the light at the first and second wavelengths respectively; and (b) and output intensity control circuit means responding to the output signals by computing a second error signal $O_1V_2-O_2V_1$ where $V_1$ and $V_2$ are the Verdet Constants of the material composition of the magneto-optic current sensor at said first and second wavelengths respectively, said second error signal being supplied to said light activating control means to modify the intensity of the light output of said first and second sources to maintain $O_1V_2-O_2V_1$ essentially constant; said input intensity control circuit means maintaining the intensity ratio of said first and second wavelength light essentially constant at the input to said magneto-optic current sensor.

3. A method for providing drift compensation for a magneto-optic current measuring system including a magneto-optic current sensor of a material composition exhibiting different Verdet Constants (V) at different light wavelengths, comprising the steps of:

alternately introducing light of first and second wavelengths into said magneto-optic current sensor, computing current levels $E_1$ and $E_2$ at the respective wavelengths, and adjusting the intensity of said light introduced into said magneto-optic current sensor to maintain the relationship $V_2E_1-V_1E_2$ essentially constant, wherein $V_1$ and $V_2$ are the Verdet constants of the material composition of the magneto-optic current sensor at said first and second wavelengths respectively.

4. In a magneto-optic current measuring system including a magneto-optic current sensor of a material composition exhibiting different Verdet Constants (V) at different wavelengths, and functioning as a Faraday rotator by receiving a polarized light input and generating a light output, the rotation of which is indicative of the current flow in an adjacent electrical conductor, and converter means for converting said light output to electrical signals:

the improvement for providing drift compensation for said system, said improvement comprising:

an input circuit means including:

(a) a first light source for emitting light at a first wavelength and a second light source for emitting light at a second wavelength;

(b) a light activating control means for alternately activating said first and second light sources; and (c) an optical coupler means for introducing the light output from said alternately activated first and second light sources to said magneto-optic current sensor;

an output circuit means including:

(a) means responsive to electrical signals representing the light output of said first and second light sources transmitted through said magneto-optic current sensor for generating first and second output signals indicative of the intensity of the light output at said first and second wavelengths, respectively; and (b) means for responding to the first and second output signals by computing the magnitude of the first output signal multiplied by $V_2$ minus the second output signal multiplied by $V_1$, where $V_1$ and $V_2$ are the Verdet constants of the material composition of the magneto-optic current sensor at said first and second wavelengths respectively; and means for adjusting the gain of at least one of said input circuit means and output circuit means to maintain the magnitude of the first output signal multiplied by $V_2$ minus the second output signal multiplied by $V_1$ essentially constant.

* * * * *